United States Patent
Miller et al.

(10) Patent No.: US 7,712,210 B2
(45) Date of Patent: May 11, 2010

(54) METHOD OF PROVIDING A PRINTED CIRCUIT BOARD WITH AN EDGE CONNECTION PORTION

(75) Inventors: Thomas R. Miller, Endwell, NY (US); Duane A. Stanke, Newark Valley, NY (US); Robert J. Testa, Owego, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 253 days.

(21) Appl. No.: 11/808,140

(22) Filed: Jun. 7, 2007

(65) Prior Publication Data

US 2008/0301933 A1   Dec. 11, 2008

(51) Int. Cl.
  *H05K 3/36* (2006.01)
(52) U.S. Cl. .............................. 29/830; 29/831; 29/851; 29/852; 156/289; 156/293; 174/260; 174/261; 174/262
(58) Field of Classification Search .................... 29/830, 29/831, 851, 852; 156/289, 293; 174/260, 174/261, 262
  See application file for complete search history.

(56) References Cited

U.S. PATENT DOCUMENTS

| 4,026,627 | A | | 5/1977 | Benasutti |
| 4,872,851 | A | | 10/1989 | Babuka et al. |
| 5,309,629 | A | | 5/1994 | Traskos et al. |
| 5,502,889 | A | * | 4/1996 | Casson et al. ............... 29/830 |
| 5,590,460 | A | * | 1/1997 | DiStefano et al. ........... 29/830 |
| 5,622,588 | A | * | 4/1997 | Weber ........................ 156/263 |
| 5,689,137 | A | * | 11/1997 | Weber ........................ 257/679 |
| 5,939,789 | A | | 8/1999 | Kawai et al. |
| 6,109,939 | A | | 8/2000 | Kondo et al. |
| 6,209,195 | B1 | | 4/2001 | Adams et al. |
| 6,324,067 | B1 | | 11/2001 | Nishiyama |
| 6,634,561 | B1 | | 10/2003 | Wallace |
| 6,688,897 | B2 | | 2/2004 | Korsunsky et al. |
| 6,818,168 | B2 | | 11/2004 | Morales |
| 6,848,175 | B2 | | 2/2005 | Fork et al. |
| 6,899,546 | B2 | | 5/2005 | Longueville et al. |
| 6,966,482 | B2 | | 11/2005 | Totani et al. |
| 6,986,917 | B2 | | 1/2006 | Takada et al. |
| 7,036,214 | B2 | | 5/2006 | Kondo et al. |
| 7,048,547 | B2 | | 5/2006 | Gottwald |
| 7,084,355 | B2 | | 8/2006 | Kosaka et al. |
| 7,147,480 | B2 | | 12/2006 | Ikeda |

* cited by examiner

*Primary Examiner*—Derris Banks
*Assistant Examiner*—Jeffrey Carley
(74) *Attorney, Agent, or Firm*—Mark Levy; Lawrence R. Fraley; Hinman, Howard & Kattell

(57) ABSTRACT

A method of making a printed circuit board in which at least two circuitized substrates are aligned and bonded together (e.g., using lamination). A gasket is provided on one of these and a facing circuitized portion on the other. The gasket forms an effective seal about the circuitized portion to prevent heated dielectric material from contacting the circuitry. After bonding, parts of the bonded structure, including the gasket, are removed to leave a projecting edge portion having circuitry thereon. This edge portion is then adapted for being positioned within an edge connector.

16 Claims, 5 Drawing Sheets

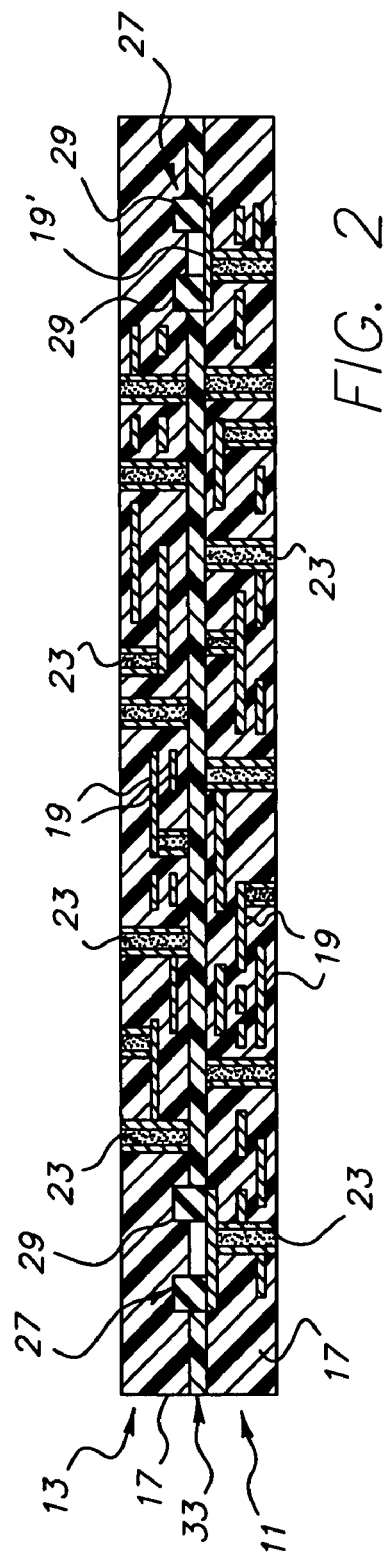
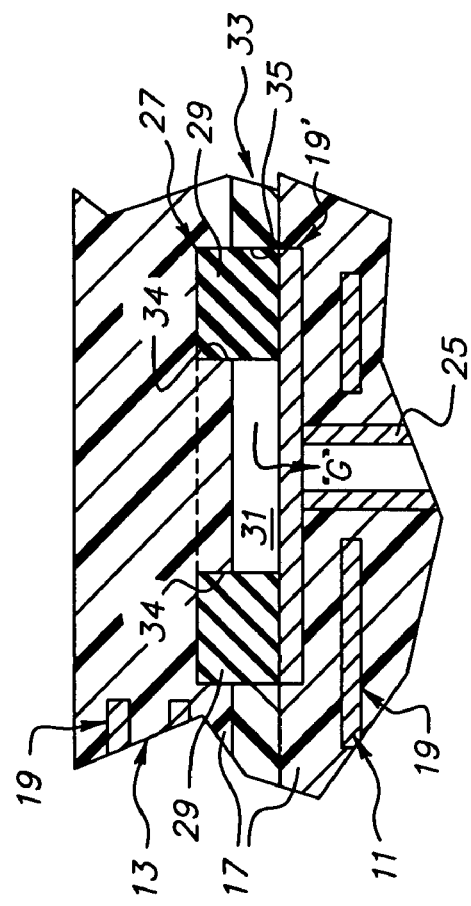

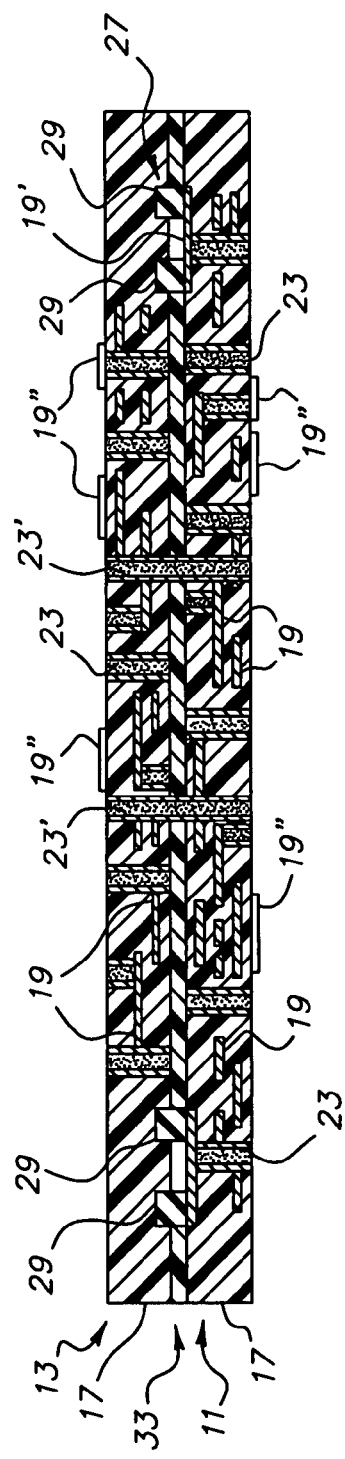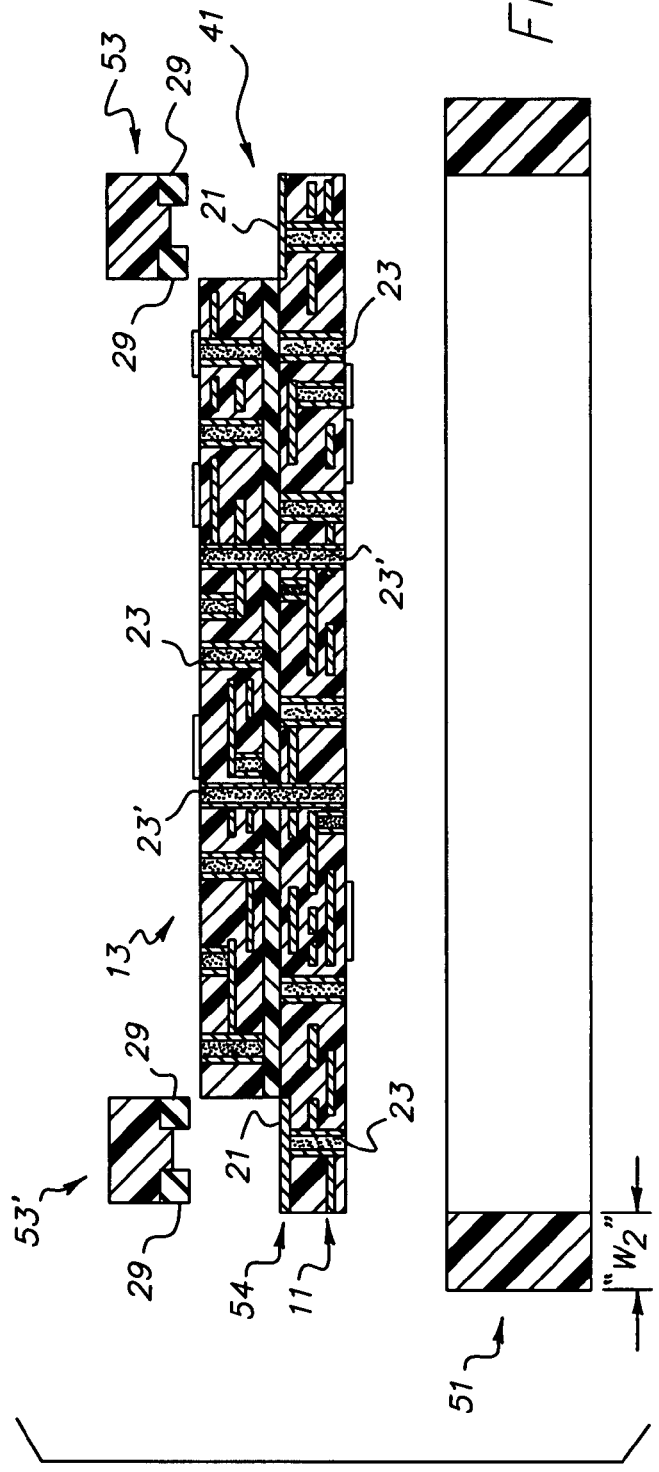
FIG. 4
FIG. 5

METHOD OF PROVIDING A PRINTED CIRCUIT BOARD WITH AN EDGE CONNECTION PORTION

TECHNICAL FIELD

This invention relates to printed circuit boards and particularly to multilayered printed circuit boards including a plurality of dielectric and conductive layers as part thereof. More particularly, the invention relates to such boards which are adapted for having an edge connecting portion such as one adapted for having an electrical connector positioned thereon and coupled thereto.

CROSS REFERENCE TO CO-PENDING APPLICATION

In Ser. No. 11/652,633, entitled "Method of Providing A Printed Circuit Board With An Edge Connection Portion And/Or A Plurality of Cavities Therein", filed Jan. 12, 2007, there is described a method of making a printed circuit board in which at least three substrates are aligned and bonded together (e.g., using lamination). Two of the substrates have openings formed therein, with each opening including a cover member located therein. During lamination, the cover members form a seal and prevent dielectric material (e.g., resin) liquefied during the lamination from contacting the conductive layers on the opposed surfaces of the inner (first) substrate. A PCB is thus formed with either a projecting edge portion or a plurality of cavities therein such that electrical connection may be made to the PCB using an edge connector or the like. Ser. No. 11/652,633 is assigned to the same Assignee as the present invention.

BACKGROUND OF THE INVENTION

When producing printed circuit boards (hereinafter also referred to as PCBs), it is often common to form printed circuitry on one or both sides of a planar rigid or flexible insulating substrate. Of increased importance today is the manufacture of multilayer printed circuits, the most common types of boards sold today in view of increased operational demands for the products, e.g., personal computers, mainframes and servers, in which such boards are implemented. In these structures the board typically consists of parallel, planar, alternating inner layers of insulating dielectric material and conductive metal. Examples of the dielectric material include fiberglass-reinforced epoxy resin (also referred to in the field as "FR4" for its flame retardant rating), polytetrafluoroethylene (e.g., Teflon, a trademark of E.I. DuPont de Nemours & Company), Driclad (a trademark of the Assignee of this invention, Endicott Interconnect Technologies, Inc.), etc. Formation of the conductive layer circuitry is typically accomplished using known photolithographic processing steps in which photo-resist is applied, selectively exposed and developed, with the resulting circuit pattern remaining on the supporting dielectric, including possibly on opposing surfaces thereof. Several of these layered elements (sometimes referred to as "cores", possibly including three or more conductive layers and two or more dielectric layers) are then aligned and bonded together using conventional lamination processing in which high temperatures and pressures are utilized. Metals used for such conductive circuit layers include copper, copper alloys, nickel and gold.

The above mentioned cores in turn may be referred to as "power" cores (if the conductive layer is to form a power plane), or by other abbreviated terminology such as "2S1P", meaning the core includes two signal planes and one power plane (with the appropriate number of dielectric layers to provide insulation, of course). Each multilayered final board may include several cores, in addition to other layers such as "sticker sheets" designed to bond one or more cores together.

It is also common in double-sided and multilayer printed circuit boards to provide conductive interconnections between the various conductive layers of the board. This is commonly achieved by providing metallized, conductive "thru holes" in the board which communicate with the layers requiring electrical interconnection. For some applications, it is desired that electrical connection be made with almost if not all of the conductive layers. In such a case, thru-holes are also typically provided through the entire thickness of the board, in which case these are often also referred to as "plated thru holes". For these, as well as other applications, it is also often desired to also provide electrical connection between the circuitry on one face of the board to a depth of only one or more of the inner circuit layers. These are referred to as "blind vias", which pass only part way through the board, as stated. In still another case, such multilayered boards often require internal "vias" which are located entirely within the board's structure and covered by external layering, including both dielectric and conductive. Such internal "vias", also referred to as "buried vias" are typically formed within a sub-part structure of the final board (such as the aforementioned "core") and then combined with other layers during final lamination of the board. For purposes of this application, the terms "thru hole" is meant to include all three types of such electrically conductive openings.

To provide the desired circuit patterns for the board, including both internal and external, those in the art have developed a variety of manufacturing sequences, many of which fall into the broad categories of "subtractive" or "additive" techniques. Common to subtractive processes is the need to etch away (or subtract) metal to expose substrate surface in areas where no circuitry is desired. Additive processes, on the other hand, begin with exposed substrate surfaces (or thin common metallization layers for additive electroplate) and build up metallization in desired areas, the desired areas being those not masked by a previously-applied pattern of plating resist material (e.g., also called photo-resist in the printed circuit board field).

Typically, thru-holes are drilled (including mechanically or, more recently, using lasers) or punched into or through the board, as well as within the cores or other sub-parts, if desired, at selected locations. Drilling or punching provides newly-exposed surfaces including hole barrel surfaces and hole peripheral entry surfaces. The dielectric substrate, and the core or sub-part, if used, each comprising a top surface, a bottom surface, and at least one exposed internal hole surface consisting partly or entirely of the dielectric insulating material, is then metallized, generally by utilization of electro-less metal depositing techniques, albeit other deposition processes are also known in the field.

In addition to the above processes, some PCBs must also be designed to accommodate what are commonly referred to as edge connectors. Various types of edge connectors are known in the art and are designed typically for being secured to a corresponding edge of the PCB in order to be electrically coupled to a pattern of circuit elements (e.g., elongated pads) formed thereon. Some edge connectors may be secured to the PCB edge using such members as pins which extend within corresponding edge openings, while a more common form of edge connector is designed for simply being frictionally positioned onto the projecting end of the edge portion. Alternatively, the connector is mounted on a "motherboard" such as within a computer and the PCB edge is then inserted therein. This latter form of connector usually includes therein a plurality of contact elements, e.g., curved blade spring contacts, which slidably engage respective ones of the elongated pads on the board edge during positioning. The result is a strong frictional fit, such that the connector may be later removed for repair, including when repair is desired for the PCB itself, or, if the connector is fixedly positioned such as on the aforementioned "motherboard," removed from the board after the PCB itself is withdrawn. This fit thus enables facile replacement of the connector. It is also possible to fit more than one edge connector onto a single PCB, including on more than one edge portion thereof. As understood from the following, the present invention is specifically directed to the formation of a multilayered PCB with the ability to make sound and facile connection to an edge connector or the like connecting structure.

The following patents describe various approaches to manufacturing printed circuit boards, including those with extending edge portions designed to accommodate edge connectors such as those described above. Examples of such edge connectors are also shown in some of the patents below.

In U.S. Pat. No. 7,147,480, there is described an approach for connecting a flexible printed circuit board to a conventional (non-flexible) printed circuit board. Patterns on both boards are aligned and connected with each other by soldering. An elongated hole is formed in the vicinity of and along the edge portion in a connecting part of the printed circuit board, and two rectangular holes communicating with the elongated hole are formed at both longitudinal ends of the elongated hole, while two notches for controlling insertion depth are provided at opposing ends of the connecting edge of the flexible printed circuit board. The leading edge portion of the flexible printed circuit board, which is left between the cut portions, is bent downward, and the bent portion is inserted into the elongate hole and the rectangular holes of the printed circuit board to position the flexible printed circuit board, and then the patterns, respectively located on the flexible printed circuit board and the printed circuit board, are connected by soldering.

In U.S. Pat. No. 7,084,355, there is described a multilayer printed circuit board in which micro-cracks or metallic migration is mitigated when a "Resin Fill Plated Through Hole" (RFP) is arranged near the edge thereof. The multilayer printed circuit board includes an inner layer having an RFP, outer layers, RFP lands, and conductor layers. The conductor layers are positioned over the RFP lands and the outer edges of the conductor layers extends outward further than the outer edges of the RFP lands. When the multilayer printed circuit board is heated, a stress is generated in and near the RFP. The conductor layers positioned so as to cover the RFP lands, exert a reaction against the stress to suppress generation of micro-cracks in the multilayer printed circuit board and thereby mitigate metallic migration in the board.

In U.S. Pat. No. 7,048,547, there is described a printed-circuit board which is formed with a front edge having a cutout. A plug is provided with a base body adapted to fit in the cutout and formed with a pair of shoulders bearing flatly on the board at edges of the cutout. A pair of wing-shaped connecting elements project oppositely from the body and lie flatly on the board adjacent the edges of the cutout so that the elements can be soldered to the board to fix the base body in the cutout.

In U.S. Pat. No. 7,036,214, there is described a method of manufacturing a rigid-flexible printed circuit board in which slits for defining two sides of a removing portion are formed in a part of plural resin films, and the plural resin films are stacked and bonded to form a circuit board. Then, a product portion is cut from the circuit board. Before the bonding, a separation sheet is disposed between predetermined adjacent layers of the plural resin films to separate the removing portion from a residual portion of the product portion. Accordingly, while the product portion is cut from the circuit board, the removing portion is separated from the product portion, because the removing portion are defined by the separation sheet, the slits, and a cutting outline of the product portion.

In U.S. Pat. No. 6,966,482, there is described the formation of lands formed on a flexible printed circuit board which are electrically connected with lands formed on a rigid printed circuit board through solder. At this point, solder resist is formed between neighboring two lands on the rigid printed circuit board, and is terminated with a projecting end portion that is interposed between the rigid printed circuit board and the flexible printed circuit board. Accordingly, when surplus solder is extruded onto the rigid printed circuit board, the solder resist can prevent solder bridges from being formed between the lands.

In U.S. Pat. No. 6,986,917, there is described the printing of a solder resist comprising a thermosetting resin on a surface of an insulating board having a conductor circuit. The solder resist is then heat-cured to form an insulating film having a low thermal expansion coefficient. A laser beam is then applied to the portion of the insulating film in which an opening is to be formed, to burn off the same portion for forming an opening, whereby the conductor circuit is exposed. This opening may be formed as a hole for conduction by forming a metal plating film on an inner surface thereof. An external connecting pad is formed to cover the opening. The film of coating of a metal is formed by using an electric plating lead, which is preferably cut off by a laser beam after the electric plating has finished.

In U.S. Pat. No. 6,899,546, there is described a printed circuit board which is provided with an attachment which surrounds surface contacts of the printed circuit board that are to be contacted by a printed circuit board connector that covers the portion of the printed circuit board and edges of the printed circuit board around the surface contacts and includes recesses corresponding to the surface contacts assuring proper connection with contacts of a printed circuit board connector.

In U.S. Pat. No. 6,848,175, there are described various methods and structures for allegedly improving the yield of out-of-plane micro-device structures, including the use of springs and coils. In one method the springs used to form out-of-plane structures are constrained via a tether to avoid bunching and entanglement. The structure, according to the authors, may be used in numerous electronic applications such as filter circuits.

In U.S. Pat. No. 6,818,168, there is described a method that puts a pair of bevels onto an edge of a printed circuit board so that the PCB can be inserted into an expansion slot of a computer. The tool has a bevel wheel, preferably with a bi-laterally symmetrical angle channel shape, that is connected to a carriage. The bevel wheel rolls along the carriage while the bevel wheel is pressed onto the edge of the PCB so as to form the pair of bevels on the edge of the PCB. No material is removed from the PCB while forming the pair of bevels. The bevel wheel is forced upon the edge using a piston that monitors and regulates the pressure applied to the edge of the PCB in order to achieve a preferred height and angular orientation of the pair of bevels.

In U.S. Pat. No. 6,688,897, there is described an electrical edge connector designed for being straddle-mounted on an edge of a printed circuit board and which includes an insulating housing having an elongated groove for mating. A support subassembly is inserted from the opposing side of the housing to expose its portions in the groove.

In U.S. Pat. No. 6,634,561, there is described a small, flat rectangular shaped electronic circuit card, such as one containing non-volatile memory, which has a row of contacts mounted on bottom surfaces of a row of recesses extending along a short edge of the card and an adjacent angled corner. At least one of the recesses opens to the angled corner and the remaining recesses open to the short edge. Two surface contacts are included in at least one of the recesses, while the remaining recesses each contain a single contact.

In U.S. Pat. No. 6,324,067, there is described a PCB and assembly which are suitable for high density mounting of an electronic component. A recess is formed in one part of the PCB and components are received in this recess and are lower than the surface of the PCB. A conductive pad is provided to the bottom of the recess and a connecting terminal and the conductive pad are electrically connected by using a solder ball or a conductive adhesive material. The recess is formed by partially removing one or more layers of plural conductive layers and insulating layers which make up the multilayer PCB.

In U.S. Pat. No. 6,209,195, there is described a surface mount connector that can be used for both single and double-sided PCBs. A telephone may have a PCB with connector access from the bottom of the telephone and keypad activation from the top of the telephone. If a double-sided PCB is used, the connector is mounted to the bottom side of the PCB, while the keypad is mounted to the top. The connector faces away from the PCB to provide access from below the telephone. If a single-sided PCB is used, the connector is mounted to the top side of the PCB, so that the keypad can also be mounted to the top side. The connector is placed, with connector access down, into an opening through the PCB. The connector extends down through the opening with the leads of the connector remaining on the top side of the PCB. The leads of the connector are secured to pads on the top side of the PCB.

In U.S. Pat. No. 6,109,939, there is described a memory card which has a card body having a concavity formed at the forward end thereof in the inserting direction and in which terminals are disposed and projections are formed between the terminals to prevent the terminals from being touched or accessed from outside. A receptacle for the memory card is also disclosed. The memory card has a simple structure designed to positively protect the terminals and easily let out dust or the like from inside, thereby permitting to assure a positive connection with the receptacle.

In U.S. Pat. No. 5,939,789, there is described a multilayer substrate which is fabricated by laminating a plurality of substrates, each comprising an insulation film, a plurality of via holes which pass through the upper surface to the lower surface of the insulation film, a wiring which is provided on the upper surface of the insulation film and the upper surface of the via holes and electrically connected with the via holes, a bonding member which is provided on the lower surfaces of the via holes and electrically connected with the via holes, and a bonding layer which is provided on the upper surface of the insulation film where the wiring is formed and the method of fabrication thereof whereby large cost reduction and high density effect are alleged to be obtained.

In U.S. Pat. No. 5,309,629, methods of fabricating multi-layer circuits are presented. In this patent, a plurality of circuit layers is stacked, one on top of the other. At least one of the circuit layers comprises a substrate composed of a polymeric material capable of undergoing bonding such as a fluoro-polymeric based substrate having vias there-through and a circuit comprised of a layer of suitable conductive material. A fusible conductive bonding material (e.g., solder) or a noble metal is applied wherever electrical connections are desired. At least one other of the circuit layers comprises a polyimide circuit (or other high temperature non-fusing polymer circuit, with or without filler or fabric reinforcement) having vias and circuits comprised of a layer of suitable conductive material with a fusible conductive bonding material (e.g., solder) or a noble metal applied wherever electrical connections are desired. Once stacked the circuits are subjected to lamination under heat and pressure to adhere each polymeric substrate to an adjacent polyimide substrate and to diffuse the noble metal or fuse the solder layers together to form an integral multi-layer circuit having solid conductive interconnects.

In U.S. Pat. No. 4,872,851, there is described an edge electrical connector for providing electrical connection to contact elements on a printed circuit board wherein torsion contacts are utilized. The contacts, actuated by a vertically moving, slidable member (e.g., a cam plate) and horizontally moving actuator (e.g., a linear cam), resume a normal, twisted configuration to effect such connection with the respective contact elements. Each contact, preferably metallic (e.g., beryllium copper), includes a curvilinear edge segment while each contact element (e.g., plated copper wire) in turn includes a curvilinear contacting surface, these two members thus providing a single point form of contact while assuring effective wiping motion to remove undesirable contaminants, debris, etc. which may be located thereon.

In U.S. Pat. No. 4,026,627, there is described an edge connector with an electrical contact including an angular engagement arm for slidably engaging a conductive surface (a pad on a PCB edge), said arm including a noble metal segment thereon for electrically contacting the surface and means for preventing transfer of material from the arm onto the noble segment. The improvement resides within the material transfer prevention means wherein the means comprises at least one elongated blade having at least one edge thereon, the blade formed so that only the edge slidably engages the conductive surface prior to the noble metal segment contacting the surface.

The present invention represents a new and unique method of forming a PCB with at least one edge portion adapted for being positioned within an edge connector which, when securely positioned to the PCB, will be electrically coupled to one or more conductors (e.g., elongated pads) on the PCB's edge. This method is accomplished in such a manner so as to prevent the incursion of dielectric material or the like onto the conductors during bonding (e.g., by lamination) of two substrates to form the PCB. It is believed that such a method will constitute a significant advancement in the art.

OBJECT AND SUMMARY OF THE INVENTION

It is, therefore, a primary object of the present invention to enhance the printed circuit board art by providing a new and unique method of producing such boards.

It is another object of the invention to provide such a process which may be performed using conventional PCB equipment and processes, thus representing a savings in manufacturing costs.

It is still another object of the invention to provide such a method which produces a projecting edge portion of the board which is facilely able to accept an edge connector thereon and provide sound electrical connection thereto.

According to one aspect of the invention, there is provided a method of making a printed circuit board which comprises the steps of providing a first circuitized substrate including a first part having a first surface including a circuitized portion thereon, providing a second circuitized substrate including a first part having a first surface including a gasket thereon, aligning the first and second circuitized substrates relative to one another such that the circuitized portion aligns with the gasket, bonding the first and second circuitized substrates together such that the gasket forms a seal about the circuitized portion, and thereafter removing the first part of the second circuitized substrate, including the gasket, to leave a remaining part of this second circuitized substrate, the first part of the first circuitized substrate having the first surface having the circuitized portion thereon and the remaining part of the second circuitized substrate forming a printed circuit board.

BRIEF DESCRIPTION OF THE DRAWINGS

FIGS. 1-5 are partial side elevational views, in section, illustrating the steps to forming a printed circuit board according to one embodiment of the invention;

FIG. 8 shows the substrates apart while FIG. 9 shows the two substrates compressed with the resulting configuration of the gasket as a result of such compression.

BEST MODE FOR CARRYING OUT THE INVENTION

Figure 1:
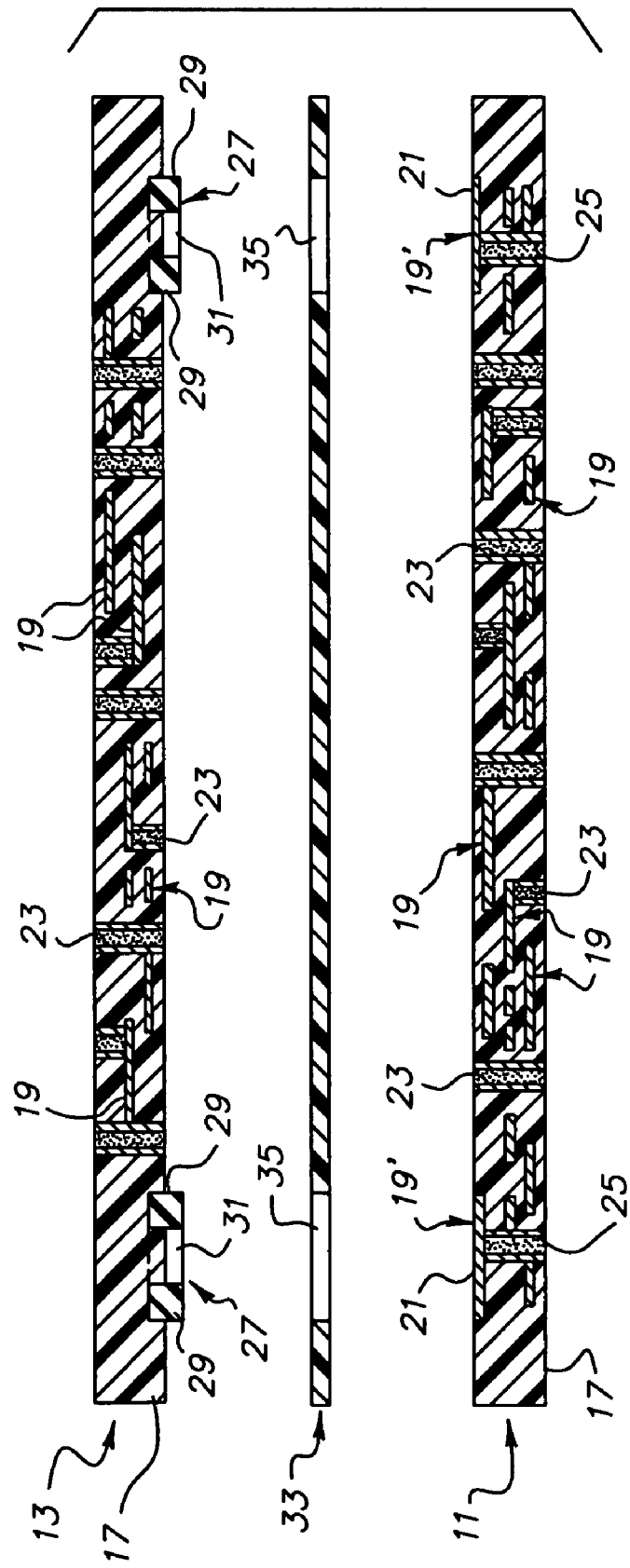

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" is meant a substrate with circuitry thereon and, possibly, therein and which is capable of being bonded to one or more other such structures to form a larger, multilayered PCB. Each circuitized substrate will include at least one dielectric layer and at least one conductive layer. It may also include a second conductive layer on the opposite side of the substrate from the at least one conductive layer wherein the substrate will include the at least one conductive layer on one of its outer surfaces. Examples of dielectric materials usable for such structures include fiberglass-reinforced epoxy resins (some referred to as "FR4" dielectric materials in the art, for the flame retardant rating of same), polytetrafluoroethylene (e.g., Teflon), polyimides, polyamides, cyanate resins, photo-imageable materials, and other like materials. Examples of conductor materials usable in the conductive layers include copper or copper alloys, but may include or comprise additional metals (e.g., nickel, aluminum, etc.) or alloys thereof. Such conductor materials are used to form conductive layers which may serve as power, signal and/or ground layers. At least one of the circuitized substrates used in this invention will include a signal layer as its at least one conductive layer and this signal layer will be positioned on one of the outer surfaces. If as such a signal layer, several conductor lines and/or pads may constitute the layer, while if used as power or ground (e.g., within one of the substrates), such layers will typically be of substantially solid construction. Combinations of both signal and power and/or ground layers are possible if the substrate includes more than one such conductive layer. Other dielectric layers which may be used between such substrates during the bonding procedure defined herein include what are known as "sticker sheets".

By the term "edge connector" as used herein is meant an electrical connector adapted for having the projecting edge of a printed circuit board positioned (e.g., inserted) therein. Typically, such edge connectors include an insulative housing and a plurality of electrical contacts (e.g., spring-type) therein, these contacts aligned relative to an internal slot or the like opening into which the PCB edge is positioned. Each contact in turn is designed to mate with (e.g., in a sliding form of contact) a corresponding conductor pad or line on the PCB's outer surface.

By the term "electrical assembly" as used herein is meant at least one printed circuit board as formed using the teachings of the present invention in combination with an edge connector positioned on the board and electrically coupled thereto.

By the term "printed circuit board" (or "PCB") as used herein is meant to include a multilayered structure comprised of two or more circuitized substrates bonded together.

In FIG. 1, two circuitized substrates (hereinafter also simply referred to as "substrates") are shown as being aligned relative to one another. A first substrate 11 is shown as positioned below the second substrate 13 but this orientation is not limiting because the substrates may be reversed in position. As is to be understood, at least two of such substrates are used to form a multilayered PCB according to the teachings herein. Understandably, more than two may be used, depending on the overall layer configuration desired for the final PCB. The invention is thus not limited to using only two substrates. Each circuitized substrate 11 and 13 includes at least one dielectric layer 17 formed of a conventional dielectric material such as fiberglass-reinforced polymer resin (also known as FR4), polytetrafluoroethylene (Teflon), (a trademark of E.I. duPont deNemours Company), Driclad dielectric material (Driclad is a registered trademark of the Assignee of this invention, Endicott Interconnect Technologies, Inc.), etc. In the embodiments shown, more than one such layer (i.e., four) are utilized, as is preferred (and typical) in PCB manufacturing. More than the four shown are also possible and the invention is not limited to a specific number as long as each substrate includes at least one. In the illustrated examples in FIG. 1, each dielectric layer 17 may possess a thickness within the range of from about one to ten mils (a mil being 0.001 inch).

Figure 6:
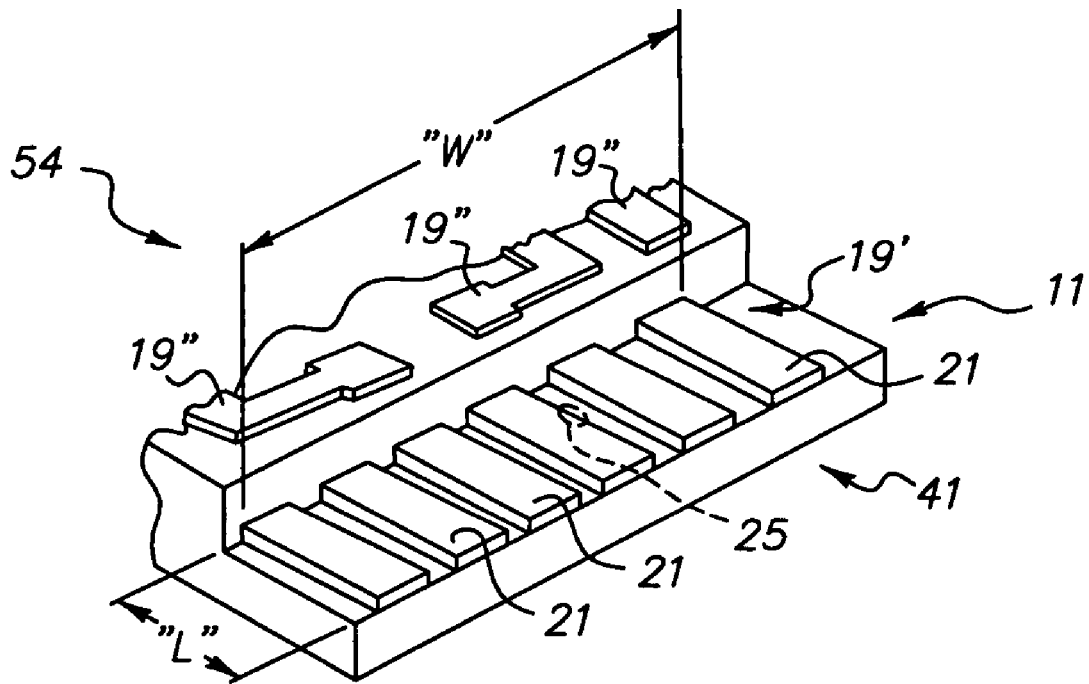
FIG. 6 is an enlarged, partial perspective view showing one embodiment of an edge portion which may be formed on a printed circuit board according to the teachings of the instant invention.

Substrates 11 and 13 further include at least one conductive layer 19. In the case of substrate 11, this conductive layer needs to be positioned on the upper surface of the substrate facing substrate 13. Other conductive layers 19 are also possible, and shown. If four dielectric layers are used, substrate 11 may include four conductive layers 19, three within the substrate and one (19') on the upper surface. (By "on the upper surface" as used herein to define layer 19' orientation is meant it may lie flush with the outer dielectric layer surface as seen in FIG. 1 and especially in FIG. 3, or it may lie atop the dielectric outer surface and thus project its thickness above said surface.) Substrate 11 may also include a conductive layer on the lower, opposite surface but this is not shown for illustration purposes. Substrate 13 is shown to include three internal conductive layers, but may of course include more, including on both opposite (upper and lower) surfaces. Accordingly, the particular layered embodiments shown are not limiting of the invention because others may be used, including combinations where one substrate includes many more dielectric and conductive layers than the other. The only requirement as defined above, is for substrate 11 to include outer conductive layer 19' thereon, and for this conductive layer to face upper substrate 13. Layers 19 and 19' are preferably copper or copper layer, known materials for PCB products, and may possess a thickness of from about 0.25 mils to about six mils. Layers 19 may function as signal, power or ground, depending again on product requirements, while layer 19' functions as a signal layer and includes several individual pads/lines 21 (FIG. 6) thereon. In one example, there may be as many as 50,000 such pads 21, each having a diameter of from about sixteen to thirty-eight mils. Six are shown in FIG. 6 for illustration purposes. Significantly, line/pads 21 are formed using conventional photolithographic processing known in PCB manufacture. This is also true for the other conductive layers 19 which form part of substrates 11 and 13, these being formed on one of the associated dielectric layers and the entire grouping of these dielectric-conductive sub-composites then laminated together to form the substrate structures shown in FIG. 1. That is, once circuitization of each conductive layer 19 has occurred, the respective dielectric layer-conductor layer sub-composites are laminated to other such sub-composites to form the respective circuitized substrate.

Each of the substrates 11 and 13 may also include thru-holes 23 as part thereof, e.g., to interconnect one or more of the conductor layers 19. In one example, each substrate 11 and 13 may include as many as 20,000 thru-holes, or as many as 5,000 thru-holes per square inch, thereby reflecting on the density of the patterns capable of being used herein. It is also preferred to include at least one opening 25 within substrate 11 relative to each of the respective circuitized portions 19'. Because two such portions 19' are shown, there will be preferably at least one opening relative to each. By the term "relative" as used in this description is meant that the opening extends within the circuitry (e.g., between two adjacent pads/lines 21. For example, opening 25 for circuitized portion 19' shown to the right in FIG. 1 (and in FIG. 6) is shown in hidden between two such lines/pads 21 in FIG. 6. The purpose of this opening with respect to the formation of the final PCB construction will be explained in detail below. It is also preferred that openings 25 function as thru-holes and electrically interconnect selected conductive layers 19, to add further to the functional capabilities of the invention. Such thru-holes 23 and 25 may be formed using conventional thru-hole formation, preferably using a laser (e.g., an ultraviolet Nd:YAG laser) and then electroplating the hole walls with a suitable metallurgy. Either electro-less or electrolytic plating may be used to deposit the desired thickness of metal to serve as the conductive medium for the thru-hole. It is also possible to add conductive paste (not shown) within selected ones of the thru-holes, or even to use this paste instead of the internally plated layers. In one embodiment, thru-holes 23 and 25 may possess diameters of about four to eight mils, with the plating (if used) comprising a total thickness of 0.5 to 1.1 mil.

It is also possible at this time to form pads and/or lines on the facing outer surfaces of both substrates, including forming pads over selected ones of the thru-holes 23. Such formation may be achieved using conventional means and further description is not considered necessary. These pads and/or lines are not shown in the Drawings for ease of explanation, but reference is made to FIG. 4 and the similar formation of pads/lines 19" on the opposing outer surfaces of the bonded pair of substrates.

As shown, substrate 11 includes two oppositely positioned circuitized portions 19' thereon. In the broader aspects of this invention, only one such portion needs to be provided. As understood, each circuitized portion will form the pads/lines on a projecting portion (i.e., portion 41 in FIG. 6) of the final PCB structure, and this circuitry will connect to respective conductors of an edge connector (defined below) when this projecting portion is positioned therein. If it is intended to only couple the final PCB to one such connector, only one such circuit portion 19' needs to be formed.

In FIG. 1, upper substrate 13 includes a pair of gaskets 27, each of these intended to align with and be compressed onto a respective one of the circuitized portions 19' when the two substrates are bonded together (described in greater detail below). This compression results in the formation of a seal about the circuit (pads/lines 21) to later protect them in the manner defined, and is an important feature of this invention. As understood, each of the circuitized portions and the gaskets are positioned on (and in the case of the gaskets, partly within) the surface of a part (here, the outer) of each substrate 11 and 13. That is, each portion 19' and gasket occupy only a relatively small area of the overall outer surface area on the respective sides shown herein. In one example, the total area of gaskets 27 represented about five percent of the total outer, lower surface area of substrate 13 while portions 19' represented about seventeen percent of the total surface area on the upper surface of substrate 11. These are understood to represent initial percentages, meaning that due to removal of parts of the substrates as explained below, such percentages will be different in the final PCB structure. Each gasket 27 is preferably comprised of fluorosilicone rubber material, one example being sold under the trade name "DSP60FS" fluorosilicone sheeting by Diversified Silicone Products, Inc., of Santa Fe Springs, Calif. This material is extremely resistant to harsh chemicals, solvents and fluids and is capable of performing at temperature ranges of from as low as minus 54 degrees Celsius (C) to as high as 260 degrees C. It also has a Shore "A" Durometer hardness rating of 60. The invention is not limited to using this particular material as others are possible, provided these offer the same important properties similar to those above. For example, suitable material is one known as "Viton." ("Viton" is a trademark of the E.I. duPont deNemours & Company.) Viton is a fluoroelastomer and is known for its excellent (200° C.) heat resistance. It, like "DSP60FS" fluorosilicone above, offers excellent resistance to aggressive fuels and chemicals, and possesses a Shore "A" Durometer hardness rating of from about 65 to about 95, depending on the grade thereof. Viton sheets may be purchased from the Abbott Rubber Company, having a business address at 2143 Lunt Avenue Elk Grove Village, Ill. Another material suitable for the gasket members of this invention is silicone rubber. Known high performance silicone rubber sheets are elastomeric and suitable for continuous use at temperatures from −60 degrees C. to as high as 218 degrees C.) and intermittent use from −75 degrees C. to even higher at 260 degrees C. Such sheets may be purchased from Ipotec, Inc., having a place of business at 41 Industrial Drive, Exeter, N.H. Still other materials usable for gaskets 27 include polyimide and Teflon (polytetrafluoroethylene), the latter also a product of E.I. duPont deNemours & Company (Teflon is a trademark of DuPont).

In the embodiment shown in greater detail in FIG. 3, each gasket 27 includes outer portions 29 and is of rectangular configuration with sides of sufficient length to full engage (contact) the outer portions of the pads/lines 21 to thereby fully seal the outer peripheral portion of the pattern of these pads/lines. For example, if the pattern as shown in FIG. 6 is from about 0.5 to two inches long ("L" in FIG. 6) and from twelve to thirty-six inches wide ("W" in FIG. 6), both of these ranges being applicable to some of the substrate dimensions possible using the teachings of this invention, gasket 27 will possess similar outer dimensions. This assumes that the resulting edge connecting portion will extend the full width of the finished PCB. In many cases, this edge portion will only constitute a portion of the full width, including when more than one edge connecting portion is formed per side of the PCB. It is understood that because outer portions 29 define a cavity or open portion 31 there-between (FIG. 3), only these outer portions 29 physically engage pads/lines 21, thereby leaving some interior portion of the pad/line pattern exposed. This is further explained below. In one example, where the edge portion being formed may possess a width less than the total board width, each outer portion 29 may possess width and length dimensions only enough to fully engage the outer peripheral portion of the pattern on this reduced width edge portion.

Figure 8:
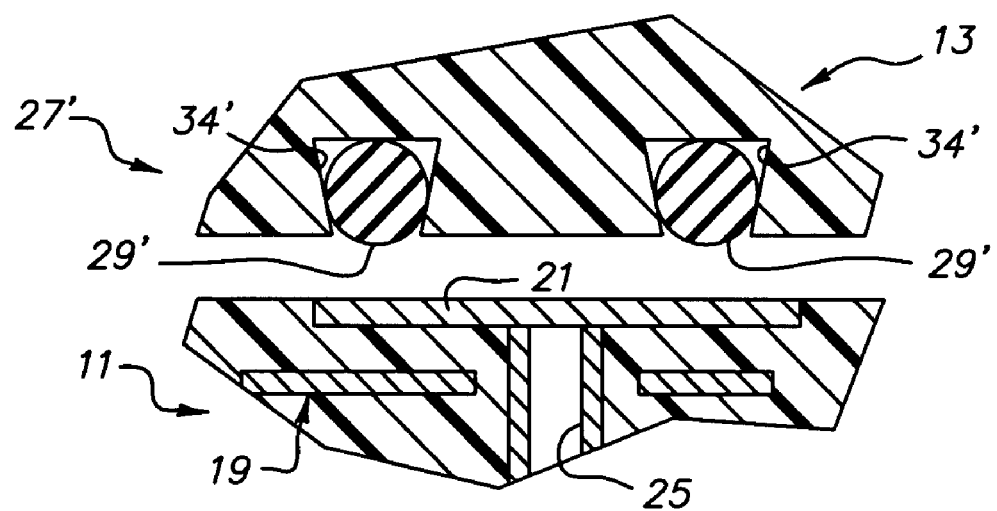
FIGS. 8 and 9 illustrate one example of opening configurations within one of the substrates of the invention designed to accommodate the gasket of the invention, and an example of a cross-sectional configuration for this gasket.

Approximately two mils of each of the portions 29 of the FIG. 3 embodiment protrude from the channels 34 in substrate 13 in which the gasket is positioned. Gasket 27 is preferably held in position within substrate 13 in FIG. 3 using a press-fit connection within the formed (e.g., routed) channels 34 to thereby enable the gasket to expand and contract as needed during the lamination process. It is also possible to use a suitable adhesive, able to withstand the temperatures and pressures associated with this lamination operation. The channels 34 as shown in FIG. 3 are of open rectangular cross-section, while the corresponding gasket is of rectangular cross-sectional configuration. This is not limiting of the invention, however, as other different configurations for the channels and gaskets are possible. In one specific example, as shown in FIG. 8, a trapezoidal shaped channel 34' is utilized, with a gasket 27' having portions 29' each of a cylindrical configuration in cross section (thereby forming an "o-ring" type of seal). Parts of each portion 29' are seen protruding from the substrate 13 in FIG. 8, similarly to gasket portions 29 in the FIG. 3 embodiment. When the two substrates 11 and 13 are compressed, portions 29' are likewise compressed, to assume the shape shown in FIG. 9. (The interim dielectric layer 33, described in greater detail below, is omitted in FIGS. 8 and 9 for ease of explanation.) As seen, the internally contained main parts of each portion 29' expand further within the trapezoidal channels 34' to substantially fill each channel, while the protruding parts expand laterally in opposing directions along the top surface of pads/lines 21. (If a dielectric layer 33 were used here, it would likewise be compressed as is layer 33 below, to the extent that the laterally expanding outer parts of portions would engage the walls of the provided opening 35 therein, as occurs below for portions 29.) It is also seen from the FIG. 8 embodiment that the trapezoidal shaped channels 34', with the downwardly sloping sidewalls, are able to readily retain the cylindrical gasket therein. It is thus not necessary to use an adhesive to assure such retention. This particular type of seal may provide less surface area contact between the opposing substrates being bonded than the seal defined below, but is considered more suitable for applications in which closer spacing are called for. It is also preferred when using "sticker sheets" (defined below) having flow characteristics at the low end of industry standards.

Figure 9:
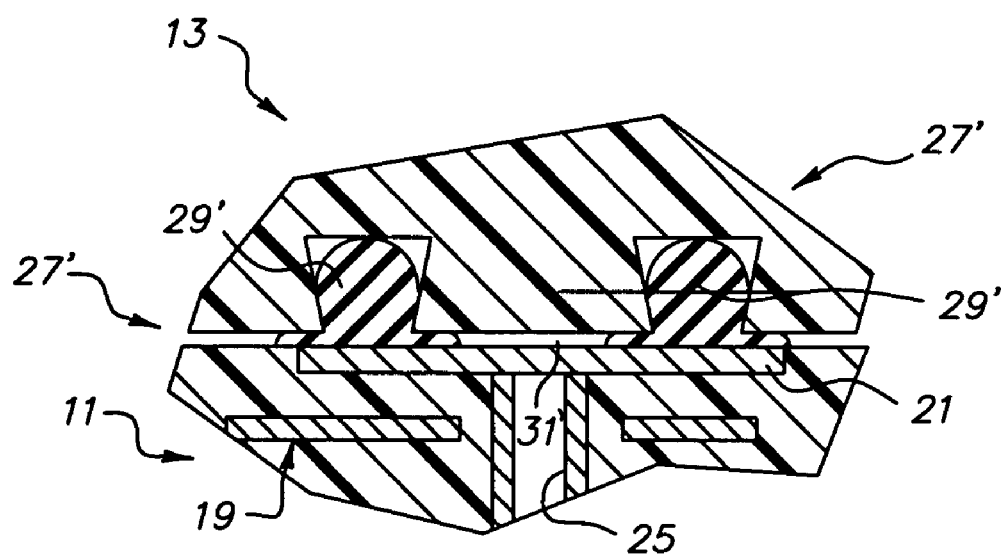

It is further noted with respect to the embodiment of FIGS. 8 and 9 that the compressed gasket 27' allows a cavity or open portion 31' just above the upper surface of pads/lines 21 so as to allow gas escape, if needed. This is similar to the cavity or open portion 31 formed as a result of the compression of the substrates in the embodiment of FIGS. 1-5.

As further seen in FIG. 1, an interim dielectric sheet (layer) 33 as mentioned above is used as part of the bonding process to bond substrate 11 to substrate 13. Layer 33 is preferably of conventional material and is also referred to in the art as a "sticker sheet." These sheets, also referred to in the art simply as "pre-preg" sheets, are conventionally used in lamination of substrates such as those shown above. Such sheets are preferably of similar material as the other dielectric materials used in the substrates, to assure a more homogeneous construction. However, these sheets may be of different dielectric materials as long as these are capable of assuring a strong bond between the substrates. Examples of such materials are described above (in the definition of "circuitized substrate"). In one embodiment, layer 33 is about 1.5 to five mils thick. It is possible in the process defined herein not to use an interim layer 33, and instead bond substrate 11 directly to substrate 13. Electrical connections between associated thru-holes of one substrate to another, as well as between mating pairs of pads or other conductors, may be achieved using conductive paste (not shown). One such form of connection is known as "Z-interconnections", from a process developed by the Assignee of this invention. If layer 33 is used, it will include openings 35 therein which function to align with the outer peripheral portion of each gasket. That is, each opening is of a size so as to allow the outer portions 29 to fit therein, as best seen in the much enlarged partial view in FIG. 3. Although layer 33 is referred to in the singular, it is possible to utilize more than one layer (or "sheet") aligned relative to each other. These individual layers will form a single integral layer 33 as a result of the lamination of substrates 11 and 13.

With each gasket 27 in position, as shown, the aligned substrates 11 and 13 are now bonded together to form a composite structure, as shown in FIG. 2. Pins (not shown) may be used to align the substrates. These pins will extend through each of the substrates and are preferably of stainless steel. Use of such pins is known and further explanation not deemed necessary. Bonding is accomplished preferably using a lamination process, and, in the example using the two substrates as shown, at a temperature within the range of from about 150 degrees C. to about 250 degrees C., over a time period of from about 60 minutes to about 120 minutes. Pressures within the range of from about 300 pounds per square inch (PSI) to about 700 PSI may be used. As a result of the relatively high compressive forces on the respective substrates during such processing, dielectric material of one or more of the substrates, being in heated, flowable state, may migrate. In addition, the dielectric material of interim layer 33 will also likely migrate, because it too will soften from the elevated temperatures. The gaskets, as better seen in FIG. 3, function to prevent the dielectric from engaging the exposed conductors 21 of the conductive portions 19' of substrate 11. This is because the gasket portions 29 are firmly pressed against this pattern of conductive members (pads/lines) with sufficient force to prevent such migration. Significantly, gaskets 27 prevent such migration from the interim dielectric layer 33, which is most likely to migrate over portions 19'. The gaskets also are able to accommodate a lack of planarity (e.g., spacings between lines or pads) in the surface being contacted, an important feature to assure an effective seal.

It has been determined that using the aforementioned fluorosilicone material for gaskets 27 and 27' at the thicknesses defined, in addition to the corresponding thicknesses for layer 33, assures formation of the defined seal over the pattern of conductors 21. This is deemed entirely unobvious because of the known fact that the sticker sheets and dielectric layers will each compress to a lesser thickness due to such high pressures, as will the fluorosilicone gaskets. By carefully identifying a thickness for the gaskets and using a material having such features as defined above, in combination with the other materials and thicknesses cited herein, a firm seal is assured.

An important feature of the invention, as mentioned above, is the formation of an opening 25 relative to the circuit pattern 19' on each edge portion (opening 25 shown hidden in FIG. 6, and on a much enlarged scale in the partial view of FIG. 3). Opening 25 is also shown in the alternative gasket-channel embodiment of FIGS. 8 and 9. In FIG. 3, opening 25 extends up through the entire thickness of substrate 11 and between two adjacent conductors 21 (one conductor 21 is shown in the background relative to opening 25 in FIG. 3). When bonding of substrates 11 and 13 occurs and if gases are formed within the cavity or recess 31 between gasket parts 29, opening 25 enables these gases to escape down through the lower substrate and externally of the structure. This is important because it prevents the gases from expanding to the extent deformation of one or both of the substrates may occur (e.g., delaminating of one or more conductors 21), as well as possible outward undesirable expansion of the gasket itself, possibly breaking the formed seal. Such gases may be present as a result of the inability of the vacuum laminator to completely evacuate the resident air surrounding the substrates. The present invention is uniquely able to prevent the above and other problems associated with such elevated gas levels in this location of the structure. Such out-gassing is represented by the arrow "G" in enlarged FIG. 3. As also discussed, opening 25 may also be a conductive thru-hole, with plating on the interior walls thereof, adding further to the capabilities of this invention. It is also within the scope of this invention to use more than one such opening 25 at this location. If one or more thru-holes are provided at this location (below circuitry 19') within the substrate, and excessive gas generation does not result during the bonding process, these openings may be covered (e.g., with a suitable tape) or filled (e.g., with conductive paste). It is also understood from the teachings herein that opening 25 in FIGS. 8 and 9 affords the same gas escapement opportunities as opening 25 in FIGS. 1-5.

The two bonded substrates may now be subjected to further drilling to provide yet more thru-holes 23' (two shown) as seen in FIG. 4. Such additional thru-holes, which may extend entirely through the combined structure of FIG. 4 as shown, will further include internally plated layering and/or conductive paste to assure conductivity through the hole. Each thru-hole may in turn electrically connect to various conductive layers to thereby provide yet further connection capabilities for the final PCB. The FIG. 4 structure may thus include many different depth thru-holes 23 and 23' and thus several circuit paths which the final PCB may utilize, e.g., to connect various electronic components such as semiconductor chips, chip carriers, resistors, capacitors, etc. which are subsequently positioned on the PCB and coupled thereto. The total possible combinations and permutations are too numerous to attempt to describe further but well understood to one of ordinary skill in the art. In addition, more circuitry in the form of signal lines/pads 19" may be formed on the outer surfaces of substrates 11 and 13, to add still further functional capabilities for the final PCB structure. Such additional circuitry may be used to accommodate external electrical components such as chip carriers and semiconductor chips, e.g., by wire-bonding and/or solder ball connect. Such components are not shown for ease of illustration but well known to those of skill in the art. Pin-in-hole components such as resistors and capacitors may also be added.

Figure 7:
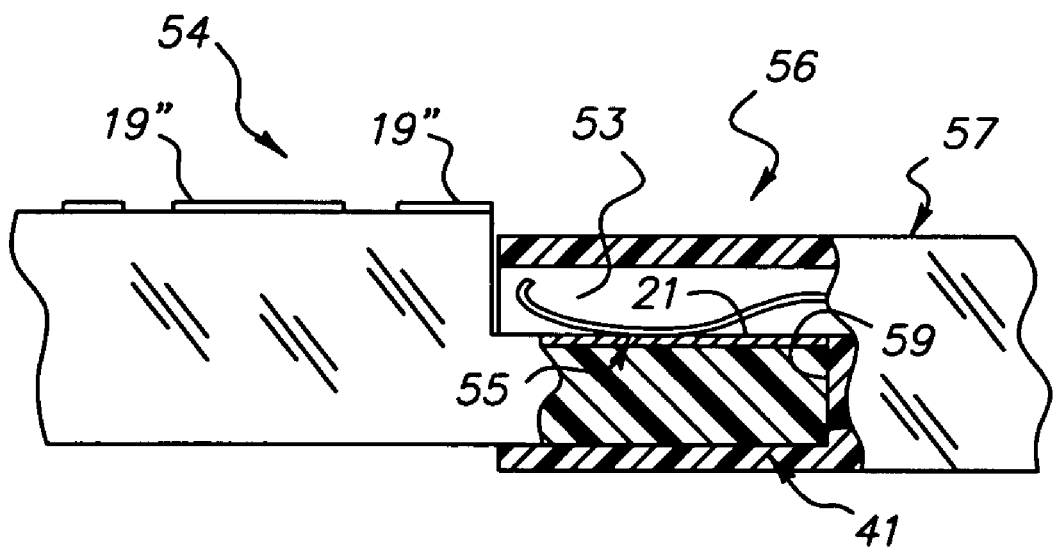
FIG. 7 is a partial side elevational view, partly in section, showing the edge portion of the printed circuit board of FIG. 6 positioned within an edge connector and electrically coupled thereto.

The bonded circuitized substrate assembly structure of FIG. 4 is now subjected to further processing to produce a projecting edge portion 41, as shown in FIG. 6 (and FIG. 7). In one embodiment, as illustrated in FIG. 5, this involves using a routing tool (not shown) to initially remove an outer peripheral portion 51 of the FIG. 4 structure. This outer portion, in this particular embodiment, is only primarily for assuring alignment (e.g., by including alignment holes and/or other indicia therein/thereon) of the structure, such as is needed to properly define the outer circuitry, the precise locations for thru-hole formation, etc. Portion 51 may also be used for placement of test coupons or other electrical features, and may even include thru-holes or other internal circuitry as part thereof. These elements are not shown in portion 51 for ease of illustration purposes. In this one embodiment, the outer peripheral portion 51 possessed a width ("W2" in FIG. 5) of about one inch (25.5 mm) and completely surrounded the remainder of the structure. Being similar to the shape of the remainder, it also is substantially rectangular. It is understood that removal of portion 51 is not essential to produce a PCB in accordance with the broader aspects of this invention. Such removal is only necessary should such an outer portion be required as part of the board processing, such as defined above. Should it be possible to provide needed alignment internally of the structure, such an outer portion is not used.

The next step of the invention involves removal of the part of second substrate 13 including the gasket therein. This is necessary to expose the circuitry 41 on the projecting portion to be defined following such removal. If the aforementioned removal of peripheral portion 51 is required, the removal of this part of substrate 13 preferably occurs following such removal. These parts are illustrated by the numerals 53 and 53' in FIG. 5 and are each of elongated "boxlike" configuration and thus rectangular in X, Y and Z cross sections. Each part is as long as the circuitry portion 41 (dimension "W") and of course the length of the gasket contained therein, and is similarly wide (similar to dimension "W" of this circuit). A quick comparison with the view in FIG. 6 clearly shows the approximate reference points for such dimensions. Each may be slightly longer and/or wider, of course, but maintaining these dimensions substantially similar to those of the circuit pattern reduces the extent of removal necessary and thereby reduces the time to perform this operation. As with part 51, removal of parts 53 and 53' is preferably accomplished using a router (not shown). As shown, the gaskets 29 are removed with these parts. Other means than routing may be utilized for these procedures, one example being to use a milling operation. The invention is thus not limited to using routing.

The resulting structure shown in FIG. 5, sans parts 51, 53 and 53', may now be referred to as a printed circuit board (PCB) 54. As such, it is able to accept edge connectors (below) and be positioned within a suitable electronic component such as a personal computer, server, mainframe and many other devices. As mentioned, it is further adapted for being positioned within a suitable connector housed with such a component such as an edge connector secured to a "motherboard".

In the example shown in FIG. 6, the edge portion 41 may extend the full width of the PCB. Alternatively, the projecting edge portion may only occupy a portion of this full width, with the corresponding edge connector having a matching width so as to be easily positioned both on the edge portion and in the recess (not shown) formed by the remainder of the edge portion. In the case of this latter embodiment, the projecting edge portion may be centrally oriented relative to the board's overall width, or may even be offset. The invention is thus able to provide a PCB with more than one possible projecting edge location.

In FIG. 7, the PCB 54 with the projecting edge portion 41 as shown in FIG. 6 is shown having an edge connector 56 positioned thereon. Connector 56 includes a plurality of spring contacts 53 with curvilinear contacting segments 55 which slidably engage the conductors 21. Each conductor may be contacted by a corresponding single spring contact, and thus several such contacts are utilized. Contacts 53 are seated within a base portion of an insulative, e.g., phenolic, housing 57. Connector 56 may be slidably positioned on PCB 54 or the edge portion 41 may be inserted with the connector until the edge of portion 41 engages a stop portion 59 of housing 57. The connector shown in FIG. 7 is not meant to limit the invention, however, as many different forms of such connectors are known in the art and thus possible.

Thus there has been shown and described a new and unique method of making a printed circuit board with a projecting edge portion designed to accommodate an external connector so as to make contact with conductors of the board. The methods as taught herein are able to utilize existing PCB manufacturing equipment and processes in addition to using the selected cover members for the purposes intended. The invention thus represents a significant improvement in the art.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a printed circuit board, said method comprising:
   providing a first circuitized substrate including a first part having a first surface including a circuitized portion thereon;
   providing a second circuitized substrate including a first part having a first surface including a sealing gasket thereon;
   aligning said first and second circuitized substrates relative to one another such that said circuitized portion on said first surface of said first part of said first circuitized substrate aligns with said sealing gasket on said first surface of said first part of said second circuitized substrate;
   bonding said first and second circuitized substrates together such that said gasket on said first surface of said first part of said second circuitized substrate forms a seal about said circuitized portion on said first surface of said first part of said first circuitized substrate for preventing wet chemistry interaction; and
   thereafter removing said first part of said second circuitized substrate, including said sealing gasket, to leave a remaining part of said second circuitized substrate, said first part of said first circuitized substrate having said first surface having said circuitized portion thereon and said remaining part of said second circuitized substrate forming a printed circuit board.

2. The method of claim 1 further including positioning a layer of dielectric material substantially between said first and second circuitized substrates prior to said bonding of said first and second circuitized substrates together and thereafter bonding said first and second circuitized substrates.

3. The method of claim 2 further including providing an opening within said layer of dielectric layer and aligning said opening relative to said circuitized portion on said first surface of said first part of said first circuitized substrate.

4. The method of claim 3 further including heating said first and second circuitized substrates during said bonding sufficiently to cause said layer of dielectric material to flow, said sealing gasket preventing said dielectric material of said layer of dielectric material from contacting said circuitized portion on said first surface of said first part of said first circuitized substrate.

5. The method of claim 4 wherein said first and second circuitized substrates are heated to a temperature within the range of from about 150 degrees Celsius to about 250 degrees Celsius for a time period of from about 60 minutes to about 120 minutes.

6. The method of claim 3 further including applying pressure onto said first and second circuitized substrates during said bonding of said first and second circuitized substrates.

7. The method of claim 6 wherein said pressure is within the range of from about 300 PSI to about 700 PSI.

8. The method of claim 1 wherein said bonding of said first and second circuitized substrates is accomplished utilizing a lamination process.

9. The method of claim 1 wherein said removing of said first part of said second circuitized substrate, including said sealing gasket, is accomplished using a routing procedure.

10. The method of claim 9 further including removing outer portions of said first and second circuitized substrates after said bonding of said first and second circuitized substrates and prior to said removing of said first part of said second circuitized substrate, including said sealing gasket.

11. The method of claim 10 wherein said removing if said outer portions of said first and second circuitized substrates after said bonding of said first and second circuitized substrates and prior to said removing of said first part of said second circuitized substrate, including said sealing gasket, is accomplished using a routing procedure.

12. The method of claim 1 further including providing at least one opening within said first part of said first circuitized substrate having said circuitized portion thereon relative to said circuitized portion, said at least one opening having access to said circuitized portion.

13. The method of claim 12 wherein said at least one opening is adapted for providing escape of gases relative to said circuitized portion which arise during said bonding of said first and second circuitized substrates.

14. The method of claim 1 further including providing at least one opening within said first part of said second circuitized substrate having said sealing gasket thereon relative to said sealing gasket, said at least one opening having access to said circuitized portion.

15. The method of claim 14 wherein said at least one opening is adapted for providing escape of gases relative to said circuitized portion which may arise during said bonding of said first and second circuitized substrates.

16. The method of claim 1 further including positioning an edge connector on said first part of said first circuitized substrate having said first surface having said circuitized portion thereon to form an electrical assembly including said printed circuit board and said edge connector.

* * * * *